(12) United States Patent
Dando (10) Patent No.: US 8,956,498 B2
(45) Date of Patent: Feb. 17, 2015

(54) APPARATUSES FACILITATING FLUID FLOW INTO VIA HOLES, VENTS, AND OTHER OPENINGS COMMUNICATING WITH SURFACES OF SUBSTRATES OF SEMICONDUCTOR DEVICE COMPONENTS

(75) Inventor: Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 292 days.

(21) Appl. No.: 13/306,122

(22) Filed: Nov. 29, 2011

(65) Prior Publication Data
US 2012/0070988 A1    Mar. 22, 2012

Related U.S. Application Data

(62) Division of application No. 11/351,640, filed on Feb. 10, 2006, now Pat. No. 8,076,244.

(51) Int. Cl.
*H01L 21/44*    (2006.01)
*H01L 21/67*    (2006.01)

(52) U.S. Cl.
CPC .... *H01L 21/67075* (2013.01); *H01L 21/67086* (2013.01); *H01L 21/6708* (2013.01)
USPC .............. 156/345.11; 156/345.51; 156/345.1; 118/400; 118/429; 118/500; 118/504; 438/667; 438/674; 257/E21.214

(58) Field of Classification Search
USPC ................... 156/345.51, 345.1; 257/E21.214; 118/500, 504, 400, 429; 438/667, 674
See application file for complete search history.

(56) References Cited

U.S. PATENT DOCUMENTS

| | | | |
|---|---|---|---|
| 3,158,499 | A | 11/1964 | Jenkin |
| 3,886,053 | A | 5/1975 | Leland et al. |
| 4,396,467 | A | 8/1983 | Anthony |
| 4,547,836 | A | 10/1985 | Anthony |
| 5,166,097 | A | 11/1992 | Tanielian |
| 5,487,218 | A | 1/1996 | Bhatt et al. |
| 6,090,474 | A | 7/2000 | Johansson et al. |
| 6,190,834 | B1 | 2/2001 | Narahara et al. |
| 6,221,769 | B1 | 4/2001 | Dhong et al. |
| 6,222,006 | B1 | 4/2001 | Kokko et al. |
| 6,261,407 | B1 | 7/2001 | Treichel et al. |
| 6,262,003 | B1 | 7/2001 | Leonard et al. |
| 6,410,976 | B1 | 6/2002 | Ahn |

(Continued)

FOREIGN PATENT DOCUMENTS

JP    2001264198    9/2001

OTHER PUBLICATIONS

Van Zant, Peter, "Photolithography Developing to Final Inspection", Chapter Nine, pp. 226-233, Microchip Fabrication A Practical Guide to Semiconductor Processing, Second Edition, 1990.

*Primary Examiner* — Sylvia R. MacArthur
(74) *Attorney, Agent, or Firm* — TraskBritt (57) ABSTRACT

A method for removing material from surfaces of at least a portion of at least one recess or at least one aperture extending into a surface of a substrate includes pressurizing fluid so as to cause the fluid to flow into the at least one recess or the at least one aperture. The fluid may be pressurized by generating a pressure differential across the substrate, which causes the fluid to flow into or through the at least one aperture or recess. Apparatus for pressurizing fluid so as to cause it to flow into or through recesses or apertures in a substrate are also disclosed.

19 Claims, 6 Drawing Sheets

(56) References Cited

U.S. PATENT DOCUMENTS

| | | |
|---|---|---|
| 6,458,696 B1 | 10/2002 | Gross |
| 6,479,382 B1 | 11/2002 | Naem |
| 6,517,697 B1 * | 2/2003 | Yamagata ............... 205/147 |
| 6,673,195 B2 * | 1/2004 | Chen et al. ............ 156/345.23 |
| 6,747,465 B2 | 6/2004 | Esashi et al. |
| 6,800,188 B2 | 10/2004 | Hagiwara et al. |
| 7,012,008 B1 | 3/2006 | Shields et al. |
| 7,172,001 B2 | 2/2007 | Tanaka |
| 7,392,815 B2 | 7/2008 | Parks |
| 7,396,447 B2 | 7/2008 | Hiatt |
| 7,494,925 B2 | 2/2009 | Hiatt |
| 7,810,513 B1 * | 10/2010 | Boyd et al. .............. 134/104.2 |
| 2002/0057099 A1 | 5/2002 | Esashi et al. |
| 2003/0106802 A1 | 6/2003 | Hagiwara et al. |
| 2003/0116176 A1 | 6/2003 | Rothman et al. |
| 2004/0089557 A1 | 5/2004 | Tsuchida et al. |
| 2004/0226745 A1 | 11/2004 | En |
| 2005/0186791 A1 | 8/2005 | Hiatt |
| 2005/0211561 A1 | 9/2005 | En |
| 2006/0037864 A1 | 2/2006 | Hiatt |
| 2006/0040494 A1 | 2/2006 | Hiatt |
| 2006/0130762 A1 | 6/2006 | Mooring et al. |
| 2007/0190785 A1 | 8/2007 | Dando |
| 2008/0035475 A1 | 2/2008 | Gebhart |
| 2012/0070988 A1 * | 3/2012 | Dando ..................... 438/689 |

* cited by examiner

APPARATUSES FACILITATING FLUID FLOW INTO VIA HOLES, VENTS, AND OTHER OPENINGS COMMUNICATING WITH SURFACES OF SUBSTRATES OF SEMICONDUCTOR DEVICE COMPONENTS

CROSS-REFERENCE TO RELATED APPLICATION

This application is a divisional of U.S. patent application Ser. No. 11/351,640, filed Feb. 10, 2006, now U.S. Pat. No. 8,076,244, issued Dec. 13, 2011, the disclosure of which is hereby incorporated herein by this reference in its entirety.

BACKGROUND OF THE INVENTION

1. Field of the Invention

The present invention relates generally to techniques for exposing or applying substrates of semiconductor device components to fluids and, more specifically, to methods in which fluid flows or is forced beyond a feature. In a particular example, the present invention relates to etch techniques and, more specifically, to etch methods in which an etchant flows or is forced beyond a feature while etching the feature. More particularly, the present invention relates to methods for forming vent holes of desired dimension in the bottom of so-called "blind ended" via holes. The present invention also relates to apparatus for causing an etchant to flow across a feature to be etched.

2. Background of Related Art

A variety of processes have been developed to form via holes through substrates, including semiconductor substrates, such as silicon wafers. Some via holes are formed so as to extend completely through a substrate, while others, which are referred to in the art as "blind ended" via holes, extend only partially through the substrate.

A blind ended via hole may be formed in the surface of a substrate by a variety of processes, including etch techniques that are timed in such a way as to permit the hole to extend only partially through the thickness of the substrate, which thickness may typically be about 700 μm to about 800 μm in the case of a full-thickness semiconductor wafer.

When blind ended via holes are formed in one surface of a substrate, a vent, which communicates with the via hole, may be formed in the other, opposite surface of the substrate. The presence of a vent facilitates the introduction of materials into and the formation of material layers within the relatively small (typically about 50 μm diameter) via hole. The size of the vent hole is typically small relative to (e.g., about one tenth of) the size of the blind ended via hole (e.g., about 5 μm diameter).

A vent may be formed by directing a laser beam of appropriate wavelength and intensity onto the surface of the substrate opposite the mouth of the via hole at a location that is in alignment with and, thus, opposite from its corresponding via hole. A focal point of the laser is positioned at a location just within the bottom of the via hole. Thus, the laser forms a vent that communicates with the other surface of the substrate, as well as a vent hole that establishes communication between the vent and the blind ended via hole.

Since a laser melts or ablates the material of the substrate, residual material may collect on the surfaces of a laser drilled features exposed to the heat of the laser (termed the "heat affected zone"), such as the vent or vent hole. This residual material is referred to as "slag." Although the laser may form a vent hole with dimensions that are within reasonable tolerances, the size of the vent hole may be effectively reduced, or even closed, by the slag that results from use of a laser to form the vent and vent hole. When slag-obstructed vent holes are undesirably small or occluded, material deposition may not proceed in a desirable fashion. As a consequence, the resulting via hole may include undesirable structural defects.

Neither conventional, relatively stagnant etching processes nor ashing effectively removes the slag.

Accordingly, there are needs for methods and apparatus for flowing or forcing etchants into or through small openings that extend substantially through a substrate to remove material from features by which the etchant passes.

SUMMARY OF THE INVENTION

The present invention includes processes and apparatus for causing, or forcing, an etchant to flow past a feature, such as a surface, from which material is to be removed. The material may protrude into, be located along a sidewall of, or obstruct a recess or aperture that extends into a surface of a substrate.

In one aspect, the present invention includes a method for causing a fluid to flow into or through recesses or apertures, also termed openings, that are formed in or through a substrate. Pressurization of the fluid may cause the fluid to flow into or through the recesses or apertures. As an example, the fluid may be pressurized by introducing at least a portion of a substrate within a volume of fluid and applying a differential pressure on opposite sides of the substrate. As the differential pressure is applied, the fluid flows or is otherwise forced into or through recesses or apertures, especially those that extend substantially through the substrate. The differential pressure may be generated across the substrate by applying a positive pressure or a negative pressure to a fixed volume of fluid on one side of the substrate. Application of a positive pressure includes applying a greater amount of pressure to one side of the substrate than is present at the opposite side of the substrate. Application of a negative pressure similarly includes application of a lesser pressure to a side of the substrate than is present at the opposite side of the substrate. Other nonlimiting examples of the manner in which the fluid may be pressurized include use of a nozzle or other apparatus that directs fluid under pressure toward a surface of a substrate that includes recesses or apertures, as well as movement of a substrate through a volume of fluid in a direction substantially transverse to a plane of the substrate, which movement generates an increased pressure at a leading surface of the substrate.

A differential pressure may be applied in a substantially continuous, substantially constant manner, applied intermittently in a patterned or random fashion, oscillated, or even alternated, to reverse the direction in which fluid flows into or through openings that extend substantially through a substrate.

Processes that incorporate teachings of the present invention may be conducted on a single wafer, multiple wafers that are positioned along a single barrier, or multiple wafers that are oriented parallel to one another and arranged in series along a flow path and transverse to the direction thereof.

The fluid may, by way of example only, comprise an etchant, solvent, or other material that dissolves or is otherwise suitable to remove material.

A method for altering the internal surfaces of a vent hole, via hole, or other aperture that extends substantially through a substrate includes causing an etchant to flow into or through the apertures. Such processes may be used to effect a number of ends, including, without limitation, removal of slag from a vent hole at the bottom of a blind ended via, to smooth the side wall of an aperture that extends substantially through the substrate, modification of the configuration of an aperture that extends substantially through the substrate, or the like.

In another aspect, the present invention includes apparatus and systems for pressurizing fluid and causing the same to flow into or through recesses or apertures that communicate with a surface of a substrate. Such apparatus and systems include, but are not limited to, differential pressure apparatus in which a substrate is positioned along a boundary between different pressures, apparatus that are configured to pressurize fluid and direct the same toward a surface of a substrate, and apparatus that are configured to carry a substrate through a volume of fluid such that pressure is increased at a leading surface of the substrate.

Other features and advantages of the present invention will become apparent to those of ordinary skill in the art through consideration of the ensuing description, the accompanying drawings, and the appended claims.

BRIEF DESCRIPTION OF THE DRAWINGS

In the drawings, which depict examples of various aspects of the present invention.

DETAILED DESCRIPTION OF THE ILLUSTRATED EMBODIMENTS

Figures 1, 2:
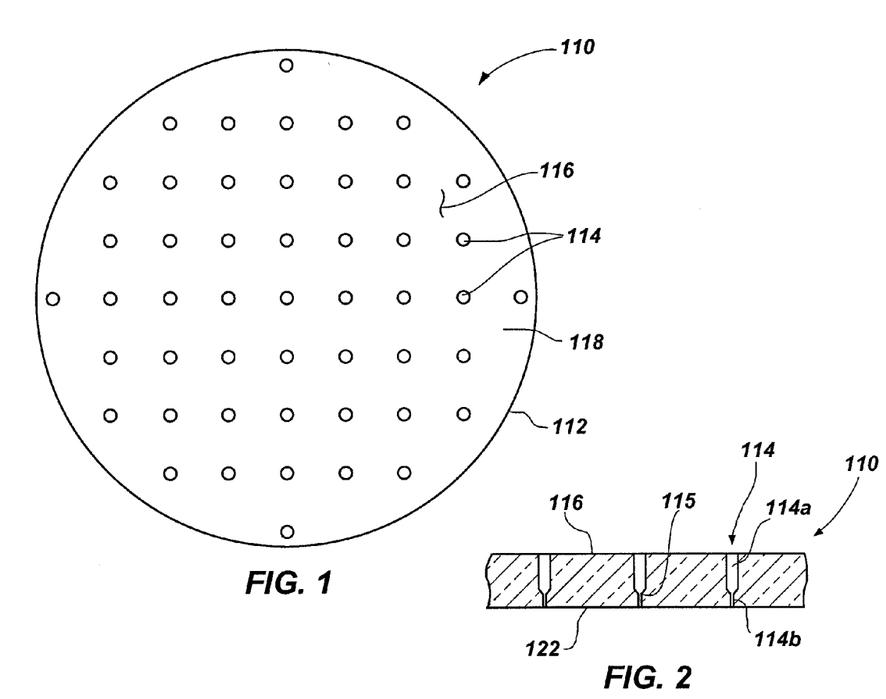
FIGS. 1 through 3 depict a substrate that may be processed in accordance with teachings of the present invention to remove obstructions or other irregularities in, or enlarge, apertures that extend through the substrate, with FIG. 1 showing an upper surface of a substrate, FIG. 2 comprising a partial cross-sectional view through a portion of the thickness of the substrate, and FIG. 3 being a representation of a bottom surface, or back side, of the substrate.
Figure 3:
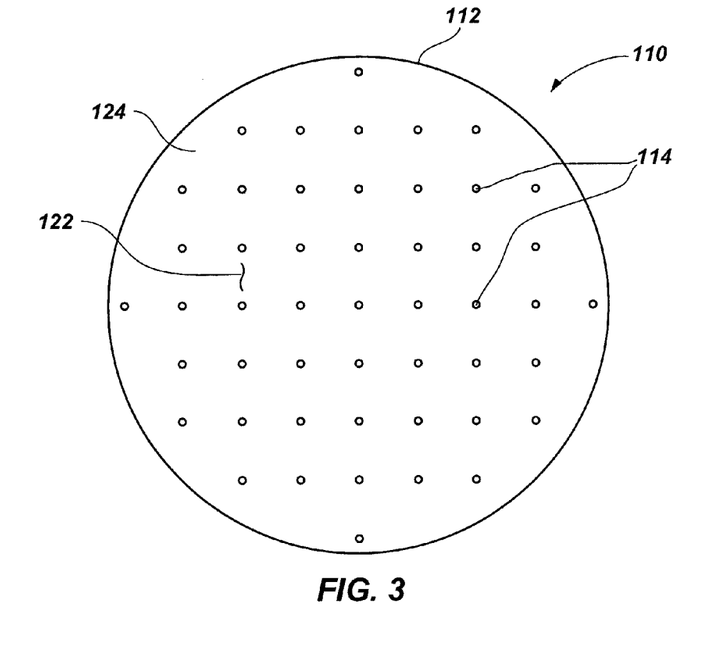

With reference to FIGS. 1 through 3, a substrate 110 that includes at least one aperture 114 extending substantially therethrough is illustrated. Substrate 110 may comprise a full or partial semiconductor substrate (e.g., a full or partial wafer of silicon, gallium arsenide, indium phosphide, or another semiconductor material), a silicon-on-insulator (SOI) type substrate (e.g., silicon-on-ceramic (SOC), silicon-on-glass (SOG), silicon-on-sapphire (SOS), etc.), a dielectric substrate (e.g., glass, ceramic, an organic material, etc.), or any other material suitable for use in forming electronic components that form or carry one or more conductive circuits.

Apertures 114 may extend partially through a thickness of substrate 110 or, as shown, substantially through a thickness of substrate 110 (e.g., from one major surface 116 thereof to an opposite major surface 122 thereof). Without limiting the scope of the present invention, apertures 114 may comprise vias that extend through substrate 110. In the case of blind vias 114a (with a diameter of, e.g., up to about 50 μm or greater), which do not extend into one major surface 116 of substrate 110, but do not extend completely through substrate 110 (i.e., to the opposite major surface 122), one or more apertures 114 may also include a relatively small vent hole 114b (with a diameter of, e.g., up to about 5 μm) that is intended to communicate with blind via 114a and that extends into the opposite major surface 122 of substrate 110. Vias or other apertures 114, including, but not limited to, vent holes 114b, may be formed by a variety of known processes, such as by laser drilling processes (e.g., with a laser intermittently pulsed from four or more different angles that converge at a single point). Some processes that are used to form apertures 114 in or through a substrate may result in obstructions 115 (e.g., material slag from melting or obliterating substrate 110 with a laser, etc.) or other irregularities (e.g., surface irregularities, such as roughness, bumps, etc.) within apertures 114. Thus, following the formation of apertures 114, they may not be ready or acceptable for subsequent processing.

Figure 4:
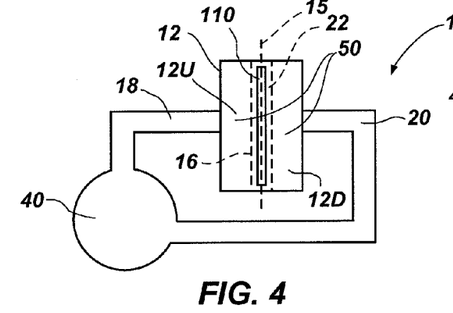
FIG. 4 is a schematic representation of a differential pressure apparatus and a method for causing an etchant or another fluid to flow through apertures of a substrate.

FIG. 4 shows a differential pressure apparatus 10, which, without limiting the scope of the present invention, may be used with a fluid, such as an etchant, solvent, or other suitable liquid (e.g., a suitable surfactant, either separately or in solution with an etchant or solvent, may facilitate wetting of the surfaces of features that are to be removed by the etchant or solvent) to remove obstructions 115 (FIG. 2) or other irregularities from recesses in (including, without limitation, relatively high aspect ratio recesses) or apertures 114 of a substrate 110, or to change a size, shape, or geometry (e.g., between one or more of cylindrical, hourglass, frustoconical, etc.) of one or more apertures 114 (FIGS. 1 through 3) or recesses of substrate 110. Apparatus 10 includes a pressurizable chamber 12 for holding a volume of fluid 50, such as an etchant, solvent, or other suitable fluid. A boundary 15, which may be located somewhat centrally within chamber 12, separates chamber 12 into an upstream side 12U and a downstream side 12D, referring to the direction in which an etchant, solvent, or other suitable fluid moves through chamber 12 when a differential pressure is generated across boundary 15. A substrate holder 16 may be positioned within chamber 12, along boundary 15.

Chamber 12 includes means for facilitating access to an interior thereof of a type known in the art (e.g., an access panel or door, a lid, etc.), which may seal against a remainder of chamber 12 and, thus, facilitate the generation of a non-ambient positive or negative pressure within chamber 12. Without limiting the scope of the present invention, chamber 12 may have dimensions or features, such as a heater, cooler, or heat transfer mechanism exposed to fluid 50 or through which fluid 50 is circulated, that facilitate maintenance of fluid 50 therein at a desired temperature.

Substrate holder 16 includes a receptacle 22 for receiving a substrate 110. Receptacle 22 includes a sealing element (not shown) that is configured to prevent fluid 50 from flowing between substrate holder 16 and an outer periphery 112 of substrate 110 as fluid 50 flows through apertures 114 that extend between opposite major surfaces 116 and 122 of substrate 110 (FIGS. 1 through 3).

Figures 5, 6:
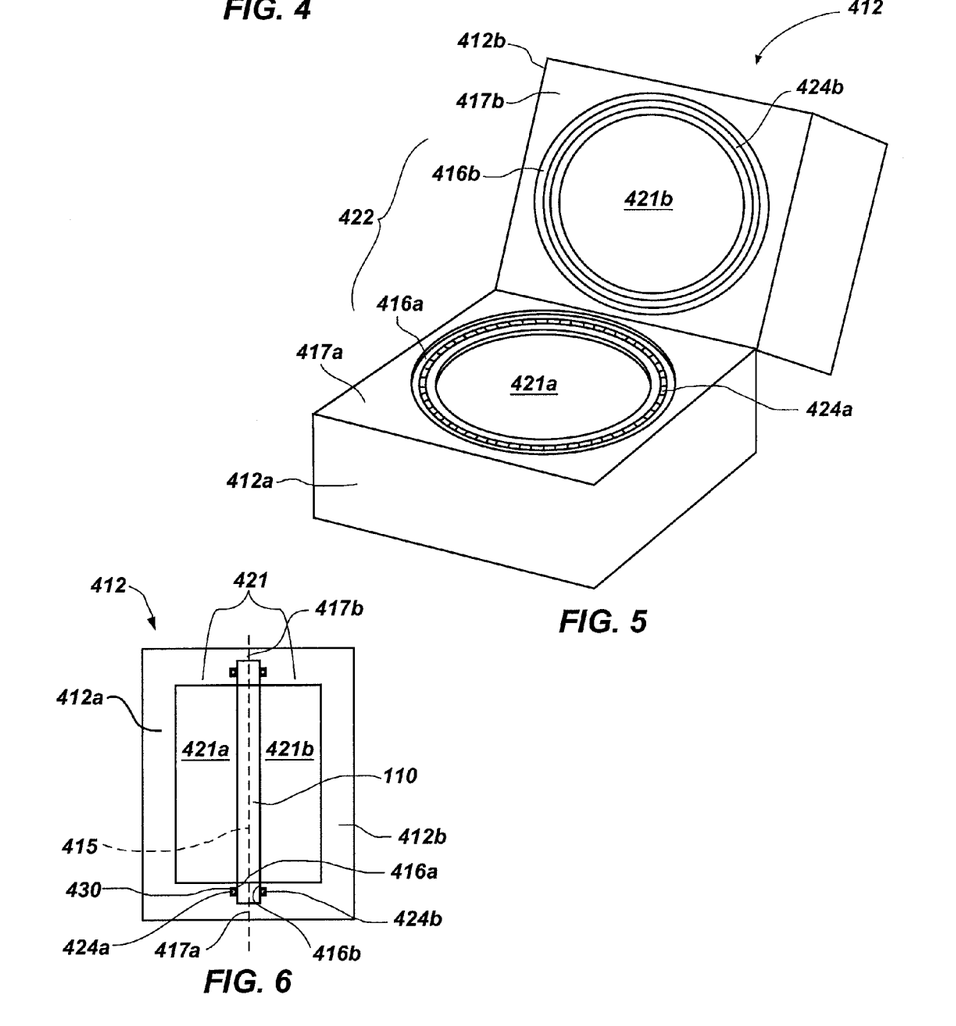
FIGS. 5 and 6 illustrate an example of a differential pressure chamber that is configured to hold a substrate at a boundary between regions of different pressure to facilitate flow of fluid through apertures that extend through or substantially through a substrate.

FIGS. 5 and 6 show an example of a chamber 12, chamber 412, that includes an integral substrate holder 16 (see FIG. 4). Chamber 412 includes two sides 412a and 412b, each of which defines a volume 421a, 421b. Sides 412a and 412b are configured to be assembled and sealingly secured together so that a combined volume 421 defined collectively by sides 412a and 412b may be pressurized with a positive pressure or a negative pressure. Edges 417a and 417b of sides 412a and 412b are configured to abut one another when sides 412a and 412b are properly assembled with each other. A ledge 416a, 416b may be recessed just beneath each edge 417a, 417b, and is configured to support peripheral portions 118, 124 (FIGS. 1 through 3) of major surfaces 116, 122 of a substrate 110, which is held in positioned at a boundary 415 between volume 421a and 421b when sides 412a and 412b are assembled with each other, with portions of major surfaces 116 and 122 exposed to volumes 421a and 421b. Together, ledges 416a and 416b form a receptacle 422 for a substrate 110. One or both of ledges 416a and 416b may form a substantially continuous support for peripheral portions 118, 124 of a major surface 116, 122 of substrate 110. A sealing element 424a, 424b (e.g., an annular gasket, an O-ring, etc.), which may have a somewhat annular shape to facilitate sealing against surface 116, 122 while exposing at least a portion of surface 116, 122 through a center thereof, may be positioned on and secured in place (e.g., with adhesive, within a groove 430, etc.) relative to each ledge 416a, 416b.

A few more, nonlimiting examples of substrate holders 16, their features, and corresponding features of chambers 12 with which they may be used are illustrated in FIGS. 7 through 12.

Figure 7:
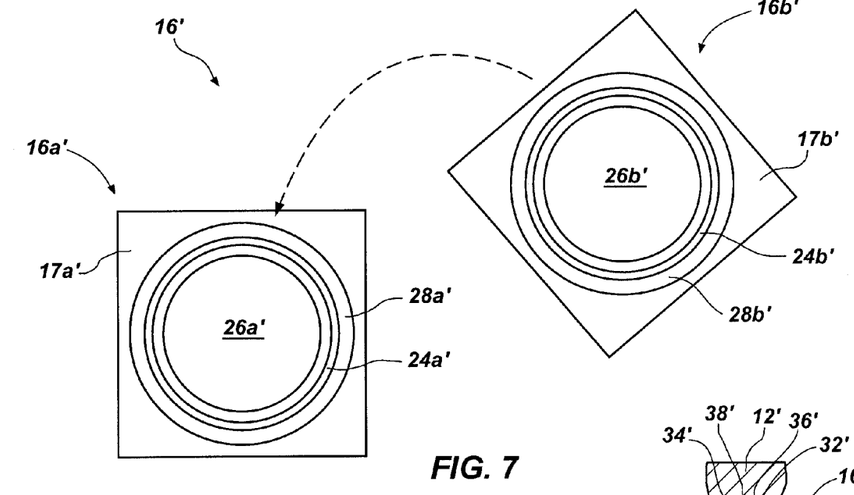
FIGS. 7 and 8 depict an example of a substrate retainer and corresponding features on a chamber that may be included in the differential pressure apparatus that incorporates teachings of the present invention.
Figure 8:
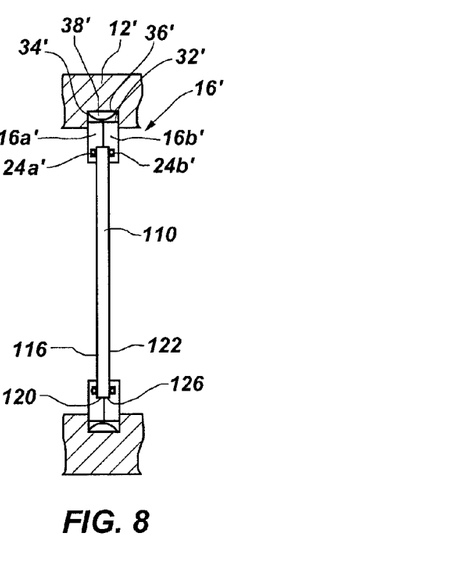

In the example illustrated in FIGS. 7 and 8, substrate holder 16' includes a pair of housing elements 16a' and 16b' that, when assembled, are configured to be positioned on opposite sides of substrate 110 (i.e., adjacent to major surfaces 116 and 122). Interior surfaces 17a' and 17b' of housing elements 16a' and 16b', respectively, are configured to face one another when housing elements 16a' and 16b' are assembled. Each housing element 16a', 16b' includes an opening 26a', 26b', which appears as a window, having substantially the same shape as and slightly smaller dimensions (e.g., diameter) than substrate 110. Interior surface 17a', 17b' of one or both housing elements 16a', 16b' may include a recess 28a', 28b' that is located around, or circumscribes, an entire periphery of opening 26a', 26b'. Recess 28a', 28b' is configured to at least partially receive a peripheral portion 118, 124 of a major surface 116, 122 of substrate 110, and may position substrate 110 at a desired location relative to opening 26a', 26b'. Thus, housing elements 16a' and 16b' and recess 28a', 28b', if any, form a receptacle for substrate 110.

With continued reference to FIG. 7, sealing element 24a', 24b' is associated with recess 28a', 28b' to seal against substrate 110, at or near outer periphery 112 thereof. As shown, sealing element 24a', 24b' may comprise a ring of compliant material (e.g., silicone or another elastomer), which may be seated within a groove (not shown) formed in recess 28a', 28b' or otherwise secured in place relative to recess 28a', 28b'. Sealing element 24a', 24b' may be sized and configured for placement against a major surface 116, 122 of substrate 110, near outer periphery 112 thereof (i.e., against peripheral portion 118, 124), as shown, or for placement against outer periphery 112 or a corner 120, 126 (see FIG. 8) formed at the junction between a major surface 116, 122 and outer periphery 112.

As shown in FIG. 8, without limiting the scope of the present invention, an assembled, secured substrate holder 16' includes an outer edge 32', which may be received within a groove 34' formed in chamber 12' to define a boundary within chamber 12'. Groove 34' may extend completely around an interior surface of chamber 12'. A sealing element 38' may be located within groove 34' (e.g., within a subgroove (not shown), within a base 36' of groove 34', etc.) and configured to seal against outer edge 32' of substrate holder 16'.

Figure 9:
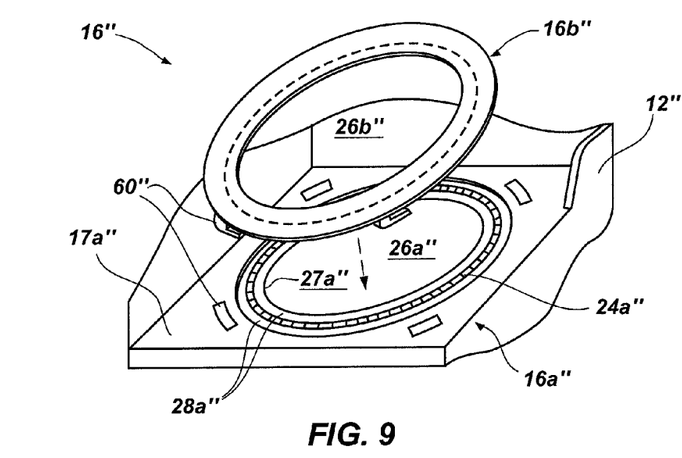
FIGS. 9 and 10 illustrate another example of a retainer and corresponding features of a chamber that may be included in a differential pressure apparatus according to the present invention.
Figure 10:
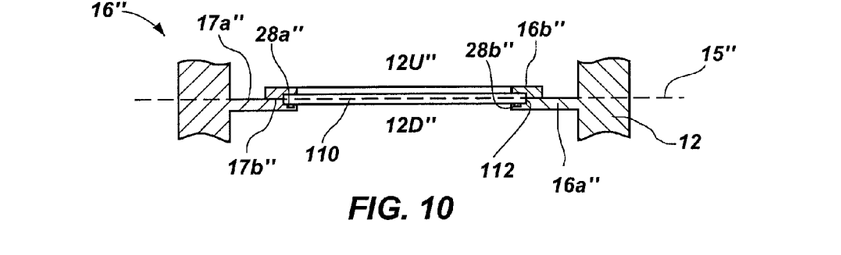

With reference to FIGS. 9 and 10, another example of substrate holder 16" and the chamber 12" within which it is located are depicted. Substrate holder 16", which is fixed within or comprises an integral part of chamber 12", defines a sealable boundary 15" between an upstream side 12U" (FIG. 10) and a downstream side 12D" (FIG. 10) of chamber 12".

Substrate holder 16" includes a fixed element 16a", which extends along boundary 15" inwardly from portions of an interior surface of chamber 12" that define the entire outer periphery of boundary 15". An opening 26a", which has dimensions that facilitate exposure of a substantial portion (e.g., substantially all, device or interposer bearing regions, etc.) of substrate 110 without exposing outer periphery 112 of substrate 110 is located centrally or somewhat centrally through fixed element 16a". A recess 28a" may circumscribe an entire periphery 27a" of opening 26a" within a substrate-carrying surface 17a" of fixed element 16a". Recess 28a" may be configured to at least partially receive a peripheral portion 118, 124 (FIGS. 1 through 3) of a major surface 116, 122 of substrate 110 and, optionally, to position substrate 110 at a desired location relative to opening 26a". Without limiting the scope of the present invention, substrate-carrying surface 17a" of fixed element 16a" may face upstream side 12U" of chamber 12". In this embodiment, substrate-carrying surface 17a" and recess 28a", if any, serve as a receptacle for substrate 110.

A sealing element 24a", which is configured to abut and seal against substrate 110 may be carried by and, optionally, secured to substrate-carrying surface 17a" of fixed element 16a", around periphery 27a" of the opening 26a" therethrough. By way of nonlimiting example, sealing element 24a" may be held within a groove (not shown) that circumscribes periphery 27a" of opening 26a" or otherwise be secured to substrate-carrying surface 17a". If substrate carrying surface 17a" of fixed element 16a" faces upstream side 12U" of chamber 12", when a substrate 110 is assembled with fixed element 16a", against sealing element 24a", a pressure differential may be established across substrate 110 and substrate holder 16". The presence of a greater pressure within upstream side 12U" than in downstream side 12D" of chamber 12" will hold substrate 110 in place against fixed element 16a", over opening 26a", and against sealing element 24a", thereby maintaining and facilitating an increase in pressure differential between upstream side 12U" and downstream side 12D", if necessary or desired.

Optionally, substrate holder 16" may include a retainer 16b" positionable over a substrate 110 that has been assembled with fixed element 16a". Retainer 16b" has smaller dimensions than fixed element 16a" to facilitate positioning of retainer 16b" over, as well as its removal from, fixed element 16a". Retainer 16b" includes an opening 26b" that is configured to substantially align with opening 26a" of fixed element 16" and to expose a substantial portion of a major surface 116, 122 of substrate 110. Additionally, retainer 16b" may include a recess 28b" on a substrate-facing surface 17b" thereof, which surface is also configured to face substrate-carrying surface 17a" of fixed element 16a" as retainer 16b" is positioned over, assembled with, and secured to fixed element 16a". Like recess 28a", recess 28b" may be configured to receive a peripheral portion 118, 124 (FIGS. 1 and 3) of a major surface 116, 122 of substrate 110 and, optionally, to position substrate 110 at a desired location relative to opening 26b". A sealing element, cushion, or other gasket (not shown) may be associated with substrate-facing surface 17b" of retainer 16b" to establish a seal against or protect a major surface 116, 122 of substrate 110 as retainer 16b" is positioned over substrate 110.

Retainer 16b" may be secured to fixed element 16a" by any suitable means for engagement 60" within the abilities of one of skill in the art (e.g., one or more clamping elements on fixed element 16a" that engage edges of retainer 16b"; features that facilitate rotatable engagement between fixed element 16a" and retainer 16b", such as corresponding tabs and slots or complementary threads, etc.).

Figure 11:
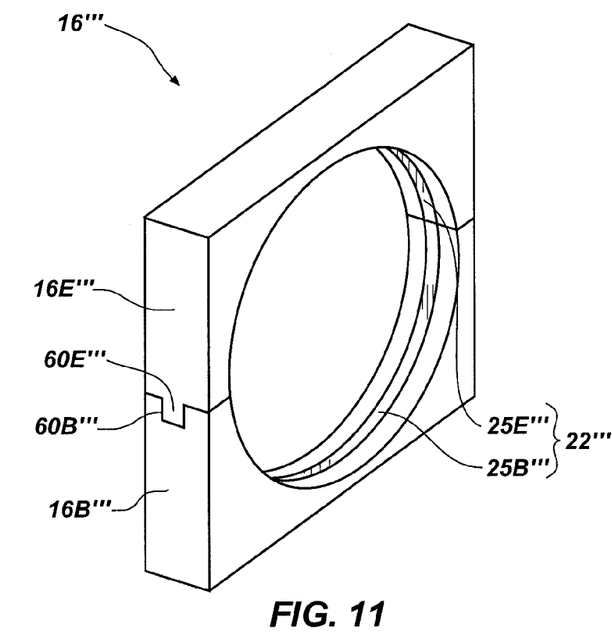
FIGS. 11 and 12 represent another example of a retainer and corresponding features of a chamber of a differential pressure apparatus of the present invention.
Figure 12:
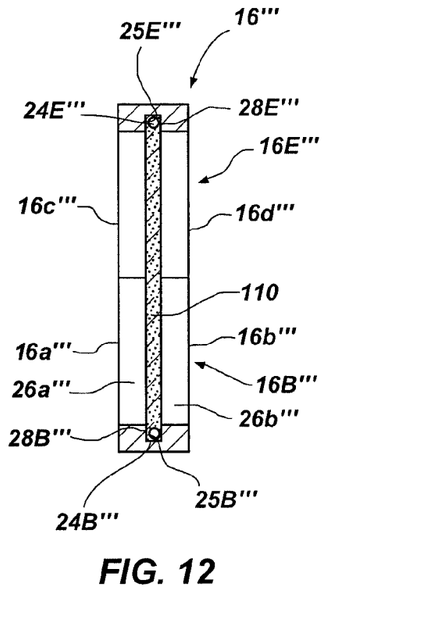

Turning now to FIGS. 11 and 12, another example of substrate holder 16''' and a portion of the chamber within which it resides are depicted.

Opposed, parallel sides 16a''' and 16b''' of a base 16B''' of substrate holder 16''' are arranged so as to define a narrow slot 25B''', or receptacle, within which a substrate 110 may be disposed. A ledge 28B''' extending between sides 16a''' and 16b''' of base 16B''' is configured to support substrate 110 and to align the same between opposed openings 26a''' and 26b''' of sides 16a''' and 16b''', respectively. A sealing element 24B''' may be positioned on and, optionally, secured to ledge 28B''' so as to form a seal against an outer periphery of substrate 110 that has been inserted into slot 25B''' as sufficient pressure is applied to substrate 110 (e.g., by a snug fit between outer periphery 112 (FIGS. 1 and 3) of substrate 110 and sealing element 24B''', by placing a load on substrate 110 along a vector that creates a seal between outer periphery 112 thereof and sealing element 24B''', or by a combination of the foregoing).

Of course, base 16B''' of substrate holder 16''' may be configured such that, when a substrate 110 that has been inserted into slot 25B''', a portion of substrate 110 protrudes from or is otherwise exposed beyond base 16B''' (e.g., a major surface 116, 122 thereof through opening 26b''', a portion of outer periphery 112 thereof, etc.) to facilitate removal of substrate 110 from slot 25B''' (e.g., with edge-engaging apparatus, as known in the art; with surface-engaging apparatus, as known in the art; manually, etc.).

In addition to base 16B''', substrate holder 16''' may include an engagement element 16E', which may be fixed to an inner surface of a chamber (not shown) or may be separate from the inner surface and configured to sealingly engage the same. Engagement element 16E''' is configured to be assembled with and to releasably engage base 16B''' of substrate holder 16'''. For example, an engagement element 16E''' that is integral with or fixed relative to the inner surface of the chamber may be assembled with base 16B''' when the chamber is closed and sealed. In the example of an engagement element 16E''' that is separate from the inner surface of the chamber, assembly may occur before the chamber with which substrate holder 16''' is configured to be used is closed and sealed. Thereafter, the inner surface of the chamber may seal against engagement element 16E''' as the chamber is closed and sealed.

As illustrated, engagement element 16E''' includes opposed, parallel sides 16c''' and 16d''', which define a narrow slot 25E''' therebetween. Sides 16c''' and 16d''' and slot 25E''' of engagement element 16E''' are respectively configured to align with sides 16a''' and 16b''' and slot 25B''' of base 16B''' when base 16B''' is assembled with engagement element 16E'''. In this manner, slot 25E''' may receive a substrate 110 that has been positioned within slot 25W" of base 16B''' as engagement element 16E''' is aligned, if necessary, and assembled with base 16B'''. Thus, when base 16B''' and engagement element 16E' are assembled, slots 25B''' and 25E''' together form a receptacle 22" for substrate 110.

Like base 16B''', engagement element 16E''' also includes a ledge 28E''' between sides 16c''' and 16d''', Ledge 28E'" carries a sealing element 24E" that is configured to abut a portion of outer periphery 112 of substrate 110 that is not engaged by sealing element 24B''' of base 16B''' when engagement element 16E''' is assembled with a substrate 110-carrying base 16B'.

Without limiting the scope of the present invention, base 16B''' and engagement element 16E''' of substrate holder 16''' may be mechanically associated with one another in any suitable manner that is within the skill of one in the art (e.g., with a simple hinge that establishes a clam-shell type relationship between base 16B''' and engagement element 16E''', a more complex mechanism that automatically aligns engagement element 16E''' over base 16B''' as these elements are assembled and, optionally, maintains the assembled relationship between these elements, etc.).

Engagement element 16E''' may optionally include at least one engagement feature 60E''' which is configured to engage a corresponding engagement feature 60B''' of base 16B''' and, thus, to maintain the assembled relationship between base 16B''' and engagement/release element 16E''' of substrate holder 16'''.

With an understanding of the broad concepts of the various aspects of the present invention, various embodiments of differential pressure apparatus, chambers 12 and substrate holders 16 will be apparent to those of ordinary skill in the art.

With returned reference to FIG. 4, additional features of a differential pressure apparatus 10 according to the present invention are described. An optional inlet 18 may communicate with upstream side 12U of chamber 12 to allow fluid 50 to flow therein or therefrom, while an optional outlet 20 may communicate with downstream side 12D of chamber 12 to allow fluid 50 to flow therein or therefrom. As illustrated, inlet 18 and outlet 20 may be coupled to a pump 40, which generates a differential pressure across boundary 15 of chamber 12 and, thus, across substrate 110 by simultaneously drawing fluid 50 from one side 12U, 12D of chamber 12 and pumping fluid 50 into the other side 12D, 12U of chamber 12.

Optionally, although not shown, inlet 18 and/or outlet 20 may communicate with one or more reservoirs or fluid sources to facilitate the introduction of different types of fluids within at least a portion of chamber 12 at a particular point during processing of a substrate 110. As an example, it may be desirable to expose a substrate 110 to a surfactant-containing solution prior to exposing substrate 110 to an etchant or solvent. Likewise, it may be desirable to rinse substrate 110 and apertures 114 thereof following processing thereof with a particular type of fluid 50.

Figure 4A:
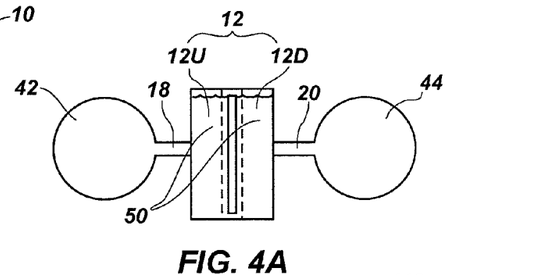
FIG. 4A is a schematic representation of a variation of the differential pressure apparatus shown in FIG. 4.

Alternatively, as shown in FIG. 4A, in addition to, or in combination with inlet 18 and outlet 20, a pressurization component may be associated with (e.g., communicate with) one or both of upstream side 12U and downstream side 12D of chamber 12. For example, and without limiting the scope of the present invention, a source 42 of positive pressure may be associated with upstream side 12U or a source 44 of negative pressure may be associated with downstream side 12D. Alternatively, either source 42 or 44 may be configured to selectively increase or decrease pressure within a corresponding side 12U, 12D of chamber 12. Either source 42, 44 may be configured to change the pressure in the side 12U, 12D of chamber 12 with which it is associated by changing the amount of fluid within that side 12U, 12D of chamber 12. For example, source 42 may create a relatively higher pressure within upstream side 12U by introducing a fluid, such as fluid 50, or another fluid (e.g., gas, liquid, etc.) that is inert or compatible with fluid 50 without displacing a significant portion of fluid 50 from upstream side 12U. Conversely, source 44 may create a relatively lower pressure within downstream side 12D of chamber 12 by removing fluid 50 or gas from downstream side 12D. Various types of pumps and associated motors may be used as source 42 or source 44, as known in the art.

Other features of differential pressure apparatus 10, including means for controlling a temperature of fluid 50 (as an other-than-ambient temperature may be required or desirable for the desired processing; e.g., silicon etchants are more effective at elevated temperatures, etc.), means for introducing substrate holder 16 into chamber 12, means for operating substrate holder 16, means for handling substrates 110, means for closing and sealing chamber 12, means for introducing fluid 50 into chamber 12 and removing fluid 50 from chamber 12, and the like, will be apparent to and understood by one of skill in the art.

Directing reference again to FIG. 4, when a substrate 110 has been placed within substrate holder 16, substrate holder 16 or a portion thereof has been sealed against an inner surface of chamber 12, if necessary, and chamber 12 is sealed, substrate holder 16 and substrate 110 together form a physical boundary, which is positioned along boundary 15, that facilitates the generation of a differential pressure within chamber 12 (i.e., a different amount of pressure within upstream side 12U from that within downstream side 12D).

Figure 13:
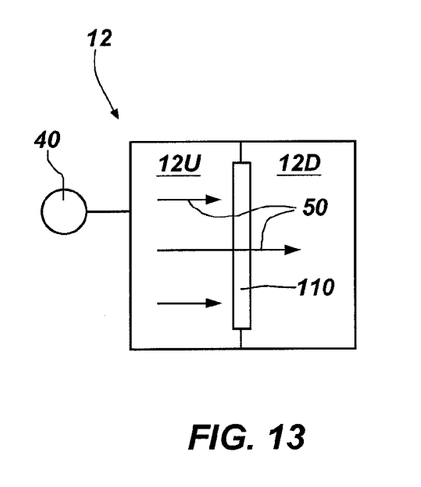
FIG. 13 depicts the use of a positive pressure to cause an etchant to flow through an at least partially obstructed aperture of a substrate.
Figure 14:
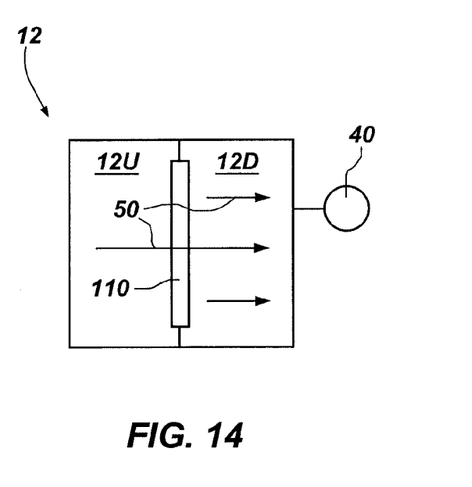
FIG. 14 illustrates the use of a negative pressure to cause an etchant to flow through an at least partially obstructed aperture of a substrate.

Once substrate 110 has been placed within receptacle 22 of substrate holder 16 and the assembly of substrate holder 16 and substrate 110 effectively isolates upstream side 12U of chamber 12 from downstream side 12D of chamber 12, a pressure differential may be applied across boundary 15 (FIG. 4) and, thus, across substrate 110. FIGS. 13 and 14 provide two examples of the manner in which a pressure differential may be applied, or generated, across substrate 110.

Referring first to FIG. 13, a pressure differential may be generated by applying a positive pressure to upstream side 12U of chamber 12. The amount of positive pressure applied exceeds an ambient pressure within downstream side 12D of chamber 12. Positive pressure may be applied, by a pump 40 or other pressure source (e.g., source 42 shown in FIG. 4A) that communicates with upstream side 12U of chamber, by introducing a fluid (e.g., gas, liquid, such as additional fluid, etc.) into the sealed upstream side 12U of chamber 12 without displacing any of the fluid previously present within upstream side 12U. The presence of greater pressure on upstream side 12U than downstream side 12D causes fluid 50 from upstream side 12U to enter into recesses or apertures 114 (FIGS. 1 through 3) of substrate 110, which is located at the boundary 15 (FIG. 4) between a relatively higher pressure and a relatively lower pressure, and to flow into downstream side 12D. As fluid 50 flows into and through apertures 114, desired processing may be effected, such as removal of any obstructions 115 (FIG. 2) or other irregularities (e.g., bumps, protrusions, surface roughness, etc.) within apertures 114 by a fluid 50 that includes one or more etchants, solvents, or other suitable fluids. The flow of fluid 50 past obstructions 115 or any other irregularities may expedite the removal process.

Turning now to FIG. 14, instead of, or in addition to, increasing pressure within upstream side 12U of chamber 12, pressure within downstream side 12D of chamber 12 may be decreased. For example, as pump 40 operates (or as source 44 of negative pressure, shown in FIG. 4A (e.g., a vacuum, another pump for removing fluid from downstream side 12D, etc.)) operates, fluid (e.g., gas, such as air, liquid, such as fluid 50, etc.) may be removed from a downstream side 12D of chamber 12 without substantially replacing or displacing (with the exception of the fluid that flows through apertures 114) (FIGS. 1 through 3) the fluid that has been removed from downstream side 12D. The lesser pressure on downstream side 12D than upstream side 12U causes fluid 50 to be drawn from upstream side 12U, into apertures 114 of substrate 110, which is located at the boundary 15 between a relatively high pressure and a relatively low pressure, and into downstream side 12D. As fluid 50 flows into and through apertures 114, desired processing may be effected.

A differential pressure may be applied in a substantially continuous, substantially constant manner, applied intermittently in a patterned or random fashion, oscillated, or even alternated, to reverse the direction in which etchant flows into or through recess or apertures 114 that extend substantially through a substrate 110 (see FIGS. 1 through 3).

As the difference in pressure across a boundary 15, or the amount of the pressure differential, may correspond to the rate at which fluid 50 flows through apertures 114 (FIGS. 1 through 3) and, thus, the amount of fluid 50 that flows past an obstruction 115 (FIG. 2) or other irregularity over a given period of time, the difference in pressure may also correspond to the rate at which material is removed from apertures 114 or surfaces thereof.

Figure 15:
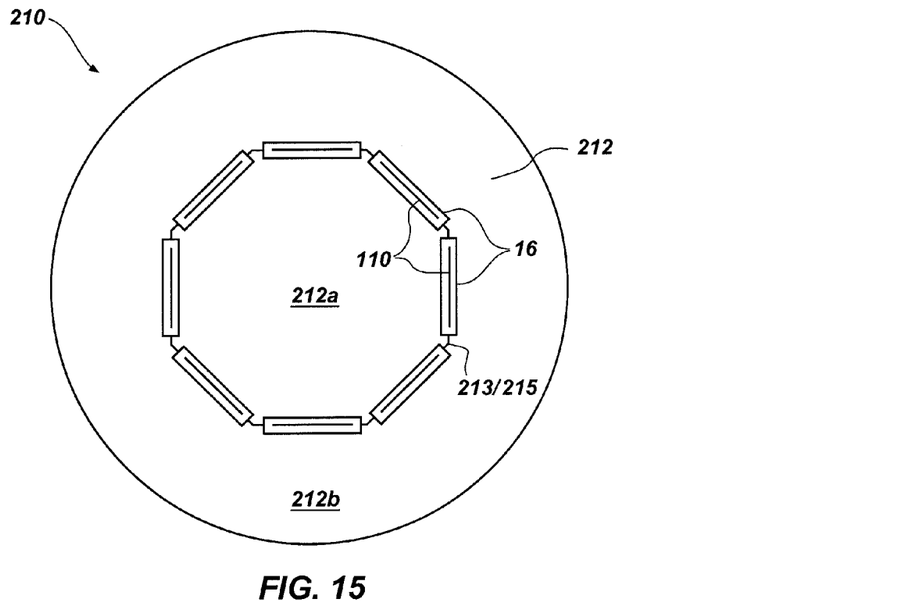
FIGS. 15 through 18 are schematic illustrations of apparatus that may be used to simultaneously cause fluid to flow through apertures of a plurality of substrates.
Figure 16:
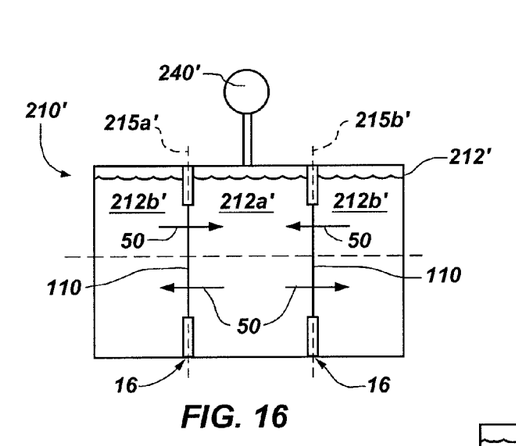
Figure 17:
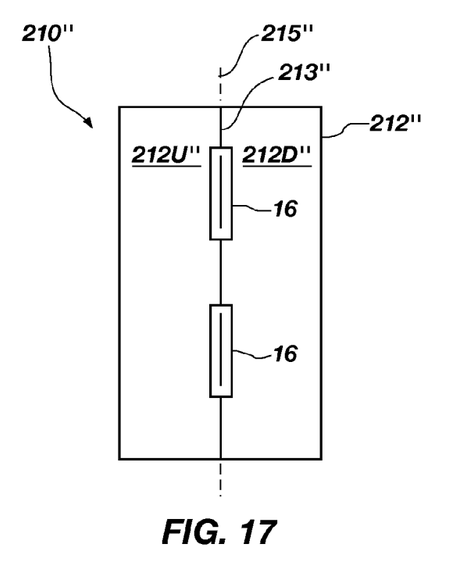

In addition to differential pressure apparatus that are configured to hold and process a single substrate 110 at a time, differential pressure apparatus configured to hold and process two or more substrates 110 simultaneously are also within the scope of the present invention, as shown in FIGS. 15 through 17.

For example, FIG. 15 depicts a differential pressure apparatus 210 that includes a chamber 212 with a frame 213 that is positioned along a boundary 215 that surrounds a centrally or somewhat centrally located portion 212a of chamber 212 and separates the same from a peripherally located portion 212b of chamber 212. Frame 213 is configured to carry a plurality of substrate holders 16. When substrates 110 are assembled with substrate holders 16, substrate holders 16 are assembled with frame 213, if necessary, and chamber 212 is sealed, frame 213, substrate holders 16, and substrates 110 collectively isolate portion 212a from portion 212b in such a way that a differential pressure may be generated across boundary 215. As this configuration of differential pressure apparatus 210 positions substrates 110 along a single boundary, it may be said that differential pressure apparatus 210 positions substrates 110 "in parallel" to one other, whether or not substrates 110 are actually oriented parallel to each other.

FIG. 16 illustrates a differential pressure apparatus 210' that includes a pressurizable chamber 212' with two spaced apart boundaries 215a' and 215b' therein. Boundaries 215a' and 215b' define a central region 212a' between two outer regions 212b'. A substrate holder 16 that carries a substrate 110 may be positioned substantially along each boundary 215a', 215b' to facilitate the generation of a differential pressure, in parallel, across each boundary 215a', 215b'. One or more pressurization components 240' may be associated with chamber 212' in such a way as to vary a pressure in central region 212a' relative to the pressure with each outer region 212b'. If, for example, a relatively lower pressure is generated within central region 212a', fluid 50 may be drawn from outer regions 212b', through apertures 114 (FIGS. 1 through 3) in substrates 110, and into central region 212b'. Alternatively, if a relatively higher pressure is generated within central region 212a' than the pressure present within outer regions 212b', fluid 50 may be forced from central region 212a', through apertures 114, and into outer regions 212b'.

In FIG. 17, another example of differential pressure apparatus 210" is shown. Differential pressure apparatus 210" is configured similarly to differential pressure apparatus 10, but includes a frame 213", which carries two or more substrate holders 16, positionable substantially along a boundary 215" of a pressurizable chamber 212" to separate and upstream side 212U" of chamber 212" from a downstream side 212D" thereof.

Figure 18:
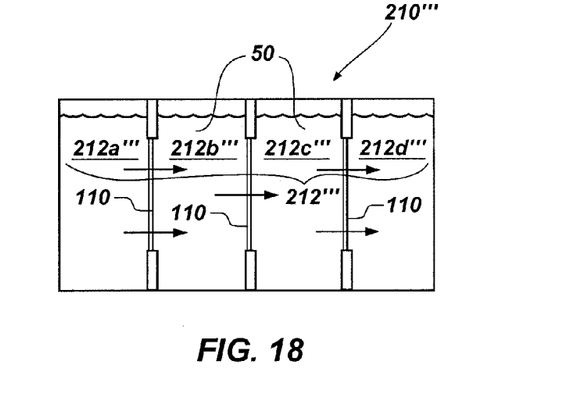

Referring to FIG. 18, another example of a differential pressure apparatus 210''' that is configured to hold and process two or more substrates 110 is depicted. Differential pressure apparatus 210''' includes plural substrate holders 16 that are oriented "in series." As a substrate 110 is assembled with each substrate holder 16, chamber 212''' is sealed, and different regions 212a''', 212b''', 212c''', 212d''', etc., are substantially isolated from one another, a pressure differential may be generated from a region 212a''' at a first end of chamber 212''' and a region 212d''' at an opposite end of chamber 212'''. As in the previously described embodiments of differential pressure apparatus, the pressure differential causes fluid 50 to be forced or drawn into or through apertures 114 (FIGS. 1 through 3) in substrates 110.

Of course, differential pressure apparatus that are configured to position at least one substrate 110 in parallel with at least one other substrate 110 and in series with still another substrate 110 are also within the scope of the present invention.

Figure 19:
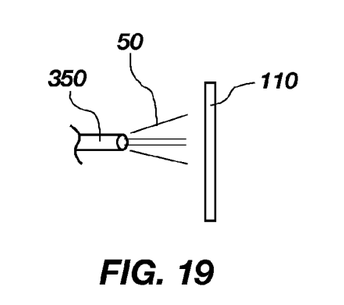
FIG. 19 is a schematic representation of a system for directing fluid under pressure onto a substrate to cause fluid to flow into or through recesses or apertures that communicate with the surface of the substrate.
Figure 20:
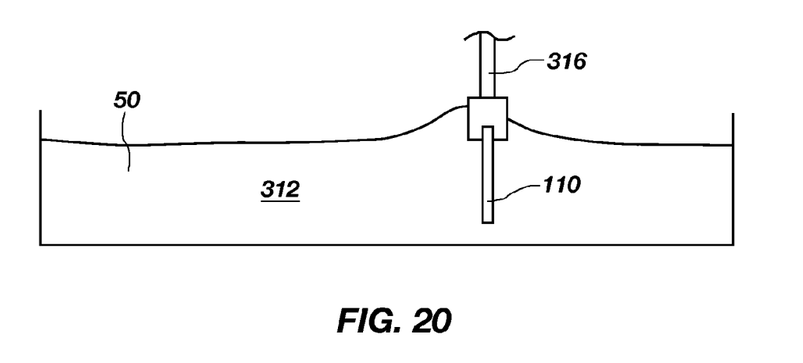
FIG. 20 schematically depicts a system for moving one or more substrates through a volume of fluid to generate an increased pressure at a leading surface of the substrate and, thus, cause the fluid to enter into or flow through recesses or apertures that communicate with that surface of the substrate.

In addition to the generation of a pressure differential across a boundary, other means and techniques for pressurizing fluid 50 (see, e.g., FIG. 4) are also within the scope of the present invention. For example, as shown in FIG. 19, fluid 50 under pressure (e.g., by an appropriate nozzle 350, etc.), may be directed toward a major surface 116, 122 of substrate 110 and into apertures 114 (FIGS. 1 through 3) or recesses that communicate with major surface 116, 122. As another example, as FIG. 20 schematically depicts, a substrate holder 316 may carry one or more substrates 110 through a volume 312 of fluid 50, generating an increase in pressure across the major surface 116, 122 (FIGS. 1 through 3) of substrate 110 and forcing fluid 50 into apertures 114 or recesses that communicate with the major surface 116, 122. Of course, from the description provided hereby, a variety of other apparatus and techniques for pressurizing fluid 50 and forcing the same to flow into or through apertures 114 or recesses in a substrate 110 may be readily apparent to one of skill in the art and, thus, are also within the scope of the present invention.

Moreover, teachings of the present invention are not limited to use with fluids 50 that are configured to remove obstructions 115 or other irregularities from apertures 114 or recesses in a substrate 110. Without limiting the scope of the present invention, teachings thereof may also be used to cause fluids that react with material at the surfaces of apertures 114 or recesses or that deposit or coat materials onto the surfaces of apertures 114 or recesses to flow into or through apertures 114 or recesses of a substrate 110.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. An apparatus for generating a pressure differential across a substrate, comprising:
a chamber;
substrate holders located substantially along a single boundary between a first region of the chamber and a second region of the chamber, each of the substrate holders configured to substantially cover and couple to only an outer periphery of a substrate such that fluid communication between the first region of the chamber and the second region of the chamber is limited to at least one aperture extending substantially through the substrate; and
at least one pressurization component associated with at least one of the first region of the chamber and the second region of the chamber.

2. The apparatus of claim 1, wherein the substrate holders are positioned in parallel along the single boundary.

3. The apparatus of claim 1, further comprising a frame configured to carry the substrate holders.

4. The apparatus of claim 1, wherein at least one of the substrate holders comprises at least one sealing element configured to seal against at least one of a peripheral edge and a peripheral portion of a surface of the substrate.

5. The apparatus of claim 1, wherein at least a portion of at least one of the substrate holders is integral and continuous with at least one inner surface of the chamber.

6. The apparatus of claim 1, wherein at least a portion of at least one of the substrate holders is configured to be received within at least one groove within at least one inner surface of the chamber, the at least one groove containing a structure positioned and configured to seal against the at least a portion of the at least one of the substrate holders.

7. The apparatus of claim 1, wherein at least one of the substrate holders comprises at least two assemblable elements each defining different portions of a single slot for retaining the substrate.

8. The apparatus of claim 1, wherein at least one of the substrate holders is configured to maintain a position of the substrate over an opening of the at least one of the substrate holders.

9. The apparatus of claim 1, wherein the at least one pressurization component is configured to selectively modify pressure within at least one of the first region of the chamber and the second region of the chamber.

10. The apparatus of claim 1, wherein the substrate holders are arranged in an annular pattern along the single boundary within the chamber.

11. The apparatus of claim 1, wherein the single boundary within the chamber comprises a substantially linear boundary between opposing inner surfaces of the chamber.

12. The apparatus of claim 1, wherein the substrate holders comprise at least one substrate holder positioned parallel to at least one other substrate holder and in series with at least one additional substrate holder.

13. A differential pressure apparatus, comprising:
a chamber;
at least one substrate holder located substantially along at least one boundary within the chamber and comprising:
  at least one recess configured to contain and support a peripheral portion of a substrate;
  at least one opening extending across substantially all of a central portion of the substrate adjacent the peripheral portion of the substrate; and
  at least one sealing element configured to limit fluid communication between a first region of the chamber and a second region of the chamber to at least one aperture extending substantially through the substrate; and
at least one pressurization component.

14. The apparatus of claim 13, wherein the at least one pressurization component is associated with at least one of the first region of the chamber and the second region of the chamber.

15. The apparatus of claim 13, wherein the substrate holder is configured to carry the substrate through a volume of fluid.

16. The apparatus of claim 13, wherein the at least one pressurization component is configured to pressurize at least one of an etchant, a solvent, and a surfactant.

17. The apparatus of claim 16, wherein the pressurization component is further configured to direct the at least one of an etchant, a solvent, and a surfactant toward the substrate.

18. The apparatus of claim 13, wherein the at least one sealing element is positioned within the at least one recess to abut the peripheral portion of the substrate.

19. The apparatus of claim 13, wherein the at least one sealing element comprises at least two sealing elements positioned within the at least one recess to abut opposing surfaces of the peripheral portion of the substrate.

\* \* \* \* \*

UNITED STATES PATENT AND TRADEMARK OFFICE
CERTIFICATE OF CORRECTION

| | | |
|---|---|---|
| PATENT NO. | : 8,956,498 B2 | Page 1 of 1 |
| APPLICATION NO. | : 13/306122 | |
| DATED | : February 17, 2015 | |
| INVENTOR(S) | : Ross S. Dando | |

It is certified that error appears in the above-identified patent and that said Letters Patent is hereby corrected as shown below:

On the title page item (54) and in the specification, column 1, line 1, Title, delete "APPARATUSES" and insert -- METHODS AND APPARATUSES --, therefor.

Signed and Sealed this
Fifth Day of May, 2015

Michelle K. Lee
*Director of the United States Patent and Trademark Office*